United States Patent
Marya et al.

(10) Patent No.: US 11,812,561 B2
(45) Date of Patent: Nov. 7, 2023

(54) THERMALLY INDUCED GRAPHENE SENSING CIRCUITRY ON INTELLIGENT VALVES, ACTUATORS, AND PRESSURE SEALING APPLICATIONS

(71) Applicant: SCHLUMBERGER TECHNOLOGY CORPORATION, Sugar Land, TX (US)

(72) Inventors: Manuel Marya, Rosharon, TX (US); Alireza Zolfaghari, Sugar Land, TX (US); Srinand Karuppoor, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 524 days.

(21) Appl. No.: 16/842,852

(22) Filed: Apr. 8, 2020

(65) Prior Publication Data

US 2021/0321521 A1    Oct. 14, 2021

(51) Int. Cl.
*H05K 3/00* (2006.01)
*C23C 18/02* (2006.01)
*B33Y 80/00* (2015.01)

(52) U.S. Cl.
CPC ............ *H05K 3/0041* (2013.01); *B33Y 80/00* (2014.12); *C23C 18/02* (2013.01); *H05K 3/0032* (2013.01)

(58) Field of Classification Search
CPC .... H05K 3/0032; C23C 18/02; C01B 32/182; C01B 32/184
See application file for complete search history.

(56) References Cited

U.S. PATENT DOCUMENTS

| | | | |
|---|---|---|---|
| 8,698,226 B2* | 4/2014 | Jain | G01N 27/4146 257/317 |
| 9,005,565 B2* | 4/2015 | Jahangiri-Famenini | B82Y 30/00 427/551 |
| 9,278,863 B2* | 3/2016 | Suh | C01B 32/186 |
| 9,760,229 B2* | 9/2017 | Nakamura | G06F 3/04164 |
| 9,783,433 B2* | 10/2017 | Downs | F16K 31/52483 |
| 10,505,193 B2 | 12/2019 | Tour et al. | |
| 2011/0059599 A1* | 3/2011 | Ward | H01L 21/02628 977/734 |

(Continued)

FOREIGN PATENT DOCUMENTS

| | | |
|---|---|---|
| CN | 110108376 A | 8/2019 |
| KR | 10-2011-0049593 A | 5/2011 |

(Continued)

OTHER PUBLICATIONS

International Search Report and Written Opinion of the equivalent PCT/US2021/025879 dated Jul. 27, 2021 (11 pages).

(Continued)

*Primary Examiner* — Michael P Wieczorek
(74) *Attorney, Agent, or Firm* — Alec J. McGinn

(57) ABSTRACT

Thermally induced graphene sensing circuitry and methods for producing circuits from such thermally induced circuits are presented in conjunction with applications to hydrocarbon exploration and production, and related subterranean activities. The thermally induced graphene circuity advantageously brings electrically interconnections otherwise absent on oilfield service tools, enabling components and tools to become smart.

19 Claims, 9 Drawing Sheets

(56) References Cited

U.S. PATENT DOCUMENTS

| | | | |
|---|---|---|---|
| 2011/0163298 A1* | 7/2011 | Sung | H01L 29/1606 257/29 |
| 2012/0111633 A1 | 5/2012 | Kumar | |
| 2012/0120019 A1* | 5/2012 | Choi | G06F 3/0219 345/174 |
| 2013/0285970 A1 | 10/2013 | Ahn et al. | |
| 2017/0221996 A1* | 8/2017 | Park | H10K 50/816 |
| 2017/0321536 A1 | 11/2017 | Hay | |
| 2018/0079132 A1 | 3/2018 | Giesbers et al. | |
| 2019/0088420 A1* | 3/2019 | Tour | H01G 11/36 |
| 2020/0405232 A1* | 12/2020 | Crockford | A61B 5/113 |

FOREIGN PATENT DOCUMENTS

| | | |
|---|---|---|
| WO | 2015/175060 A2 | 11/2015 |
| WO | 2016/133571 A2 | 8/2016 |

OTHER PUBLICATIONS

J. Lin, et al, "Laser-induced porous graphene films from commercial polymers," Nature Communications, pp. 1-8, 2014.

R. Ye, et al, "In Situ Formation of Metal Oxide Nanocrystals Embedded in Laser-Induced Graphene," ACS Nano, vol. 9, p. 9244, 2015.

F. Clerici, et al, "In situ MoS2 Decoration of Laser-Induced Graphene as Flexible Supercapacitor Electrodes," ACS Appl. Mater. Interfaces, vol. 8, p. 10459, 2016.

J. Zhang, et al, "Efficient Water-Splitting Electrodes Based on Laser-Induced Graphene," ACS Appl. Mater. Interfaces, vol. 9, p. 26840-26847, 2017.

Pranati Nayak, "Monolithic laser scribed graphene scaffolds with atomic layer deposited platinum for the hydrogen evolution reaction," Journal of Materials Chemistry A, No. 38, 2017.

X. Li and et. al., "A 1000-Volt Planar Micro-Supercapacitor by direct-write laser engraving of Polymers," in IEEE 30th Int. Conf. Micro Electro Mech. Syst., Las Vegas, NV, USA, 2017.

Z. Zhang et. al., "Visible light laser-induced graphene from phenolic resin: A new approach for directly writing graphene-based electrochemical devices on various substrates," Carbon, vol. 127C, pp. 287-296, 2018.

L.-Q. Tao, et al, "An intelligent artificial throat with sound-sensing ability based on laser induced graphene," Nature Communications, vol. 8, p. 14579, 2017.

Tao LQ., "A Flexible 360-Degree Thermal Sound Source Based on Laser Induced Graphene.," Nanomaterials, vol. 6, pp. -8, 2016.

Zhang C., "Monolithic and Flexible ZnS/SnO2 Ultraviolet Photodetectors with Lateral Graphene Electrodes," Small, vol. 13, No. 18, p. 1604197, 2017.

R. Rahimi, et al, "Highly Stretchable and Sensitive Unidirectional Strain Sensor via Laser Carbonization," ACS Appl. Mater. Interfaces, vol. 8, p. 4463-4470, 2015.

D. Vanegas, "Laser Scribed Graphene Biosensor for Detection of Biogenic Amines in Food Samples Using Locally Sourced Materials," Biosensors, vol. 8, No. 2, p. 42, 2018.

P. Nayak, "Highly Efficient Laser Scribed Graphene Electrodes for On-Chip Electrochemical Sensing Applications," Advanced Electronic Materials, vol. 2, No. 10, 2016.

C. Fenzl and et. al., "Laser-Scribed Graphene Electrodes for Aptamer-Based Biosensing," ACS Sensors, vol. 2, No. 5, pp. 616-620, 2017.

A. Nag et. al., "Sensing system for salinity testing using laser-induced graphene sensors," Sensors and Actuators A: Physical, vol. 264, pp. 107-116, 2017.

K. W. Tan et. al., "Transient laser heating induced hierarchical porous structures from block copolymer-directed self-assembly," Science, vol. 349, No. 6243, p. 54, 2015.

R. Ye, et al, "Laser-Induced Graphene Formation on Wood," Advance Materials, vol. 29, No. 37, 2017.

* cited by examiner

THERMALLY INDUCED GRAPHENE SENSING CIRCUITRY ON INTELLIGENT VALVES, ACTUATORS, AND PRESSURE SEALING APPLICATIONS

FIELD

Aspects of the disclosure relate to thermally induced graphene on fully or at least partially polymeric surfaces. More specifically, aspects of the disclosure relate to graphene sensing circuitry for use in intelligent systems for hydrocarbon exploration and production, and related subterranean activities.

BACKGROUND

Recent oil and gas developments in oilfield technologies have resulted in increased capabilities for prognostic methods and tools for exploration and production of hydrocarbon, and related subterranean activities (e.g., gas sequestration, waste disposal, geothermal). These methods and tools look to reduce maintenance costs, maximize operational reliability and create differentiation between competing technologies. As will be understood, smart components can be used to create value for customers in several areas as well as differentiate between different competing technologies. The creation of smart components that can withstand the rigors of downhole environments is technologically and economically challenging.

Downhole environments have several challenges associated with them, including high or greatly variable heat, pressure, and structural loadings from shock and vibration for instances. To qualify a component for a downhole environment, manufacturers attempt to design components that will have a designated failure rate below a specified threshold to minimize financial risk from failure. High technology items are usually more complicated in design and operation; therefore, these items are more prone to breakage, even from normal use, in addition to being more costly to operators. High technology items in downhole environments have their market share. To further accommodate and respond to needs of more prognostics and real-time data, significant engineering redesign is needed on current tool and tool strings. Manufacturers of such tools shy away from using the highest technology offerings due to the risk of early failure, resulting in potential reduction in future market share.

There is a need to provide high technology-based offerings that are suitable for downhole environments, without major redesign iterations.

There is an additional need to provide these offerings that are simple, scalable, robust and that will not induce new forms of failure critical to the basic functions of the tools.

There is a further need to provide methodologies that provide for ease of manufacturing as well as cost effective manufacturing.

SUMMARY

So that the manner in which the above recited features of the present disclosure can be understood in detail, a more particular description of the disclosure, briefly summarized below, may be had by reference to embodiments, some of which are illustrated in the drawings. It is to be noted that the drawings illustrate only typical embodiments of this disclosure and are therefore not to be considered limiting of its scope, for the disclosure may admit to other equally effective embodiments without specific recitation. Accordingly, the following summary provides just a few aspects of the description and should not be used to limit the described embodiments to a single concept.

In one example embodiment, a method for producing thermally induced graphene sensing circuitry is disclosed. The method may comprise preparing a surface of a component for placement of a coating on the surface and coating at least a portion of the surface with first polymer or polymer-rich composite, applying a thermal scan to generate a graphene-rich pattern on at least a portion of the surface of the first polymer, or polymer rich composite. The method may also comprise coating at least a second portion of the surface of the component with the second polymer, or polymer rich composite; and optionally repeating all above steps to build up a significant thickness of sensory materials.

In another embodiment, a method for producing thermally induced graphene sensing circuitry on an oil field service component is disclosed. The method may include cleaning a surface of the oil field service component for placement of a coating on the surface; coating at least a portion of the surface of the component with a polymer, or polymer-rich composite; applying a graphene-rich pattern to the surface of the component; and coating at least a second portion of the surface of the component with a coating; and optionally repeated the above steps In another embodiment, a method for producing thermally induced graphene sensing circuitry in an oil field service component is disclosed. The method may include producing a first portion of the oil field service component through an additive manufacturing process, wherein a polymer or polymer-rich composite that may or may not include graphene. The method may also comprise pyrolyzing a surface of the oil field service component in a pattern, wherein the pyrolyzing causes the graphene to accumulate in the pattern. The method may also comprise producing the second portion of the oil field service component with additional additive manufacturing.

BRIEF DESCRIPTION OF THE DRAWINGS

The subject disclosure is further described in the detailed description which follows, in reference to the noted plurality of drawings by way of non-limiting examples of the subject disclosure, in which like reference numerals represent similar parts throughout the several views of the drawings, and wherein.

DETAILED DESCRIPTION

Figure 1:
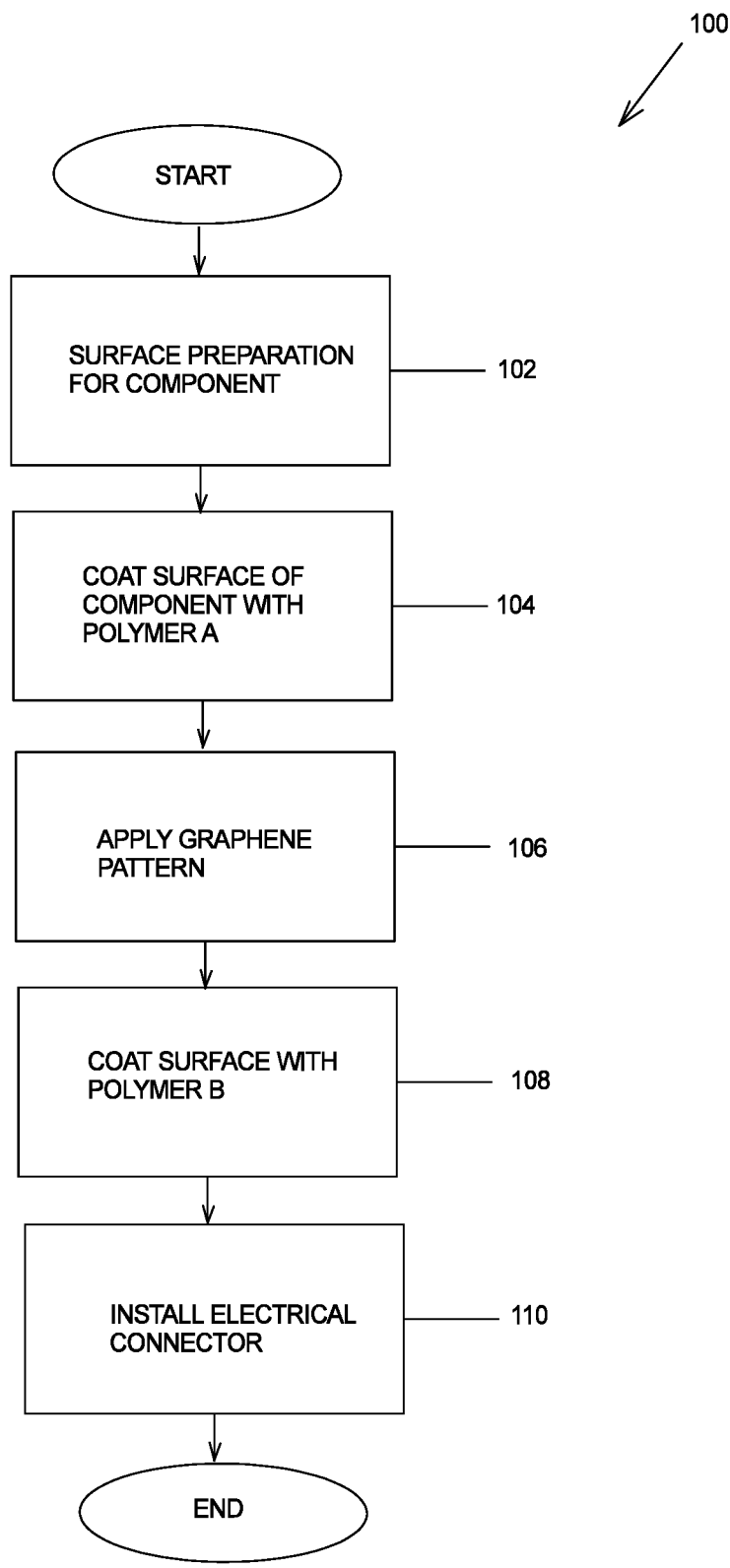
FIG. 1 is a flowchart of a method of a manufacturing process for thermally induced graphene sensing circuitry in one example embodiment of the disclosure.

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the claims except where explicitly recited in a claim. Likewise, reference to "the disclosure" shall not be construed as a generalization of inventive subject matter disclosed herein and shall not be considered to be an element or limitation of the claims except where explicitly recited in a claim.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first", "second" and other numerical terms, when used herein, do not imply a sequence or order unless clearly indicated by the context. Thus, a first element, component, region, layer or section discussed herein could be termed a second element, component, region, layer or section without departing from the teachings of the example embodiments.

When an element or layer is referred to as being "on," "engaged to," "connected to," or "coupled to" another element or layer, it may be directly on, engaged, connected, coupled to the other element or layer, or interleaving elements or layers may be present. In contrast, when an element is referred to as being "directly on," "directly engaged to," "directly connected to," or "directly coupled to" another element or layer, there may be no interleaving elements or layers present. Other words used to describe the relationship between elements should be interpreted in a like fashion. As used herein, the term "and/or" includes any and all combinations of one or more of the associated listed terms.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details, and that numerous variations or modifications from the described embodiments are possible. As used herein, the terms "above" and "below", "up" and "down", "upper" and "lower", "upwardly" and "downwardly", and other like terms indicating relative positions above or below a given point are used in this description to more clearly describe certain embodiments.

Aspects of the disclosure relate to thermally induced graphene. Thermally induced graphene may be used to help construct smart components for hydrocarbon Exploration and Production, and related subterranean applications. In embodiments, intelligent components may be manufactured from thermally induced graphene that are created as a part of commercial equipment, such as valves, actuators, and sealing devices. In the aspects described, graphene-rich areas may be used to create intelligent components by using a local thermal scan to produce graphene to desired areas. For example, a laser may be used to heat localized areas according to a pattern. This pattern is by intent graphene rich, thereby allowing electrons to flow in the graphene-rich areas compared to graphene-free or non-thermally induced graphene areas. Thus, by locally heating the substrate in areas, circuitry may be constructed on a surface of a suitable polymer or polymer-rich composite component. After creating the graphene enriched areas, deposition of materials may occur over the top of the newly created graphene enriched areas, thereby creating a three-dimensional structure upon which electrons may travel. The process may be repeated, eventually leading to thick coating or components that are conducive to electrification.

In embodiments, intelligent components may be made by creating smart coatings onto standard metallic based parts, thereby allowing electrical current along designated pathways. In other embodiments, structures may be laid upon one another to create a three-dimensional structure for the circuitry, rather than a two-dimensional surface coating. This creation of smart components may be used for sealing polymeric elements (intelligent seals), tubular goods, pipes, threaded coupling stocks, pressure housings and plugs. In such constructions, there is a benefit to detect and measure electrical changes, namely electrical impedance or resistance. Methods of monitoring for prognostic health measurement and operational assurance are also described.

Referring to FIG. 1, a method 100 for production of thermally induced graphene sensing circuitry associated with oil field equipment and operations is described. At 102, a surface that will receive the circuitry is prepared. The preparation may include cleaning of the surface through chemical solvents and/or mechanical action. The surface may be a surface of a valve, a tool string, a plug or other downhole equipment body and accessories. Surface preparation may be similar to that performed prior to coating a piece of equipment prior to coverage by a coating. The cleaning may remove, for example, surface mechanical defects, corrosion products, oxidation, and removal of oils or solvents that may be present from the production of the body of the piece of equipment being coated. At 104, a surface coating is performed on the body with a first material. As illustrated in the method 100, the coating may be a polymer or other coating, including polymer-rich coatings such as reinforced polymer-ceramic coatings. In the example described, the coating may have one or more oxide, nitride, carbide reinforcing phases, or one or more carbon components such as carbon nanotubes, fluorene, or graphene, or sulfides and phosphides. The coating may be applied through different methods, including spray processes and additive manufacturing processes. The graphene rich component, required to produce a circuitry, is generated within the coating according to a suitable thermal scan pattern that is projected onto the surface. At 106, a pattern that is graphene-rich is created on to the surface coating placed in 104. The pattern may be in the form of a printed circuit that is desired to be created within the placed coating. The pattern may be performed by a laser on to the surface, a plasma source, especially a micro-plasma source. The laser or plasma at the surface coating induces a heat or thermal influx that partially transforms, where applied, the polymer or polymer-rich coating into graphene. At 108, a second coating of a material may be performed. In embodiments, the second coating may be a different surface coating than the surface coating applied at 104. The second surface coating may be a second polymer, or polymer-rich composite coating. The second coating may be also applied by spraying and/or additive manufacturing as non-limiting embodiments. The second polymer may be designed to offer different properties, high fluid compatibility to the surrounding environment when by intent designed to be the last coating layer built onto the surface. The second surface coating may leave specific areas of the pattern created at 106 "open" or uncovered such that access to the pattern is achieved. At 110 the method continues with addition of electrical connections to the pattern created at 106. The electrical connections may be, for example, copper or gold-plated connections to endpoints in the circuit. The second surface coating may be a polymer, polymer-rich composite, or may be a coating system other than a polymer, such aa a ceramic. As a non-limiting example, the second surface coating may be an insulator that will prevent the transmission of electricity through the circuit.

As will be understood, multiple layered circuits may be developed by the method 100 described above. The method 100 may be augmented by performing different layers of coatings with graphene and layers without graphene with interspersed laser pattern generation. Thus, three-dimensional circuits may be created according to the needs of the user. In other embodiments, tracks created by a laser may be exposed to a greater or lesser degree, allowing a greater or lesser amount of graphene to be located in the pattern created during the scan. This will allow for a greater or lesser amount of resistance within this section of the circuit. Although described as a laser, other types of energy delivery systems may be used to create patterns. Such energy delivery systems may include electromagnetic sources and micro-plasma sources.

In the embodiments described, several types of coatings may be used in the creation of the thermally induced graphene sensing circuitry. These may be coatings made from a single polymer, multiple polymers, or blends of polymer and non-polymers, but overall the coating remains predominantly polymeric and suitable for forming graphene. For example, a coating that is rich in Polyetheretherketone ("PEEK") may be used. In the instance of a PEEK coating, thickness may be between, in non-limiting embodiments, 0.02 cm to 0.1 cm (0.00508 in to 0.254 in). In other embodiments, Polytetrafluoroethylene ("PTFE") may be used. In the instance of a PEEK and PTFE layer, and blends of PEEK and PTFE, non-limiting layer thickness may be 0.0008"-0.002" (0.002-0.005 cm). In still further embodiments, polyimides may be used. In the instance of a polyimide film being used, non-limiting layer thickness may be 0.0003"-0.020" (0.00076-0.0508 cm). Further embodiments, polyphenylene sulfide ("PPS") may be used. In the instance of a polyimide film being used, non-limiting layer thickness may be 0.0003"-0.020" (0.00076-0.0508 cm).

Figure 2:
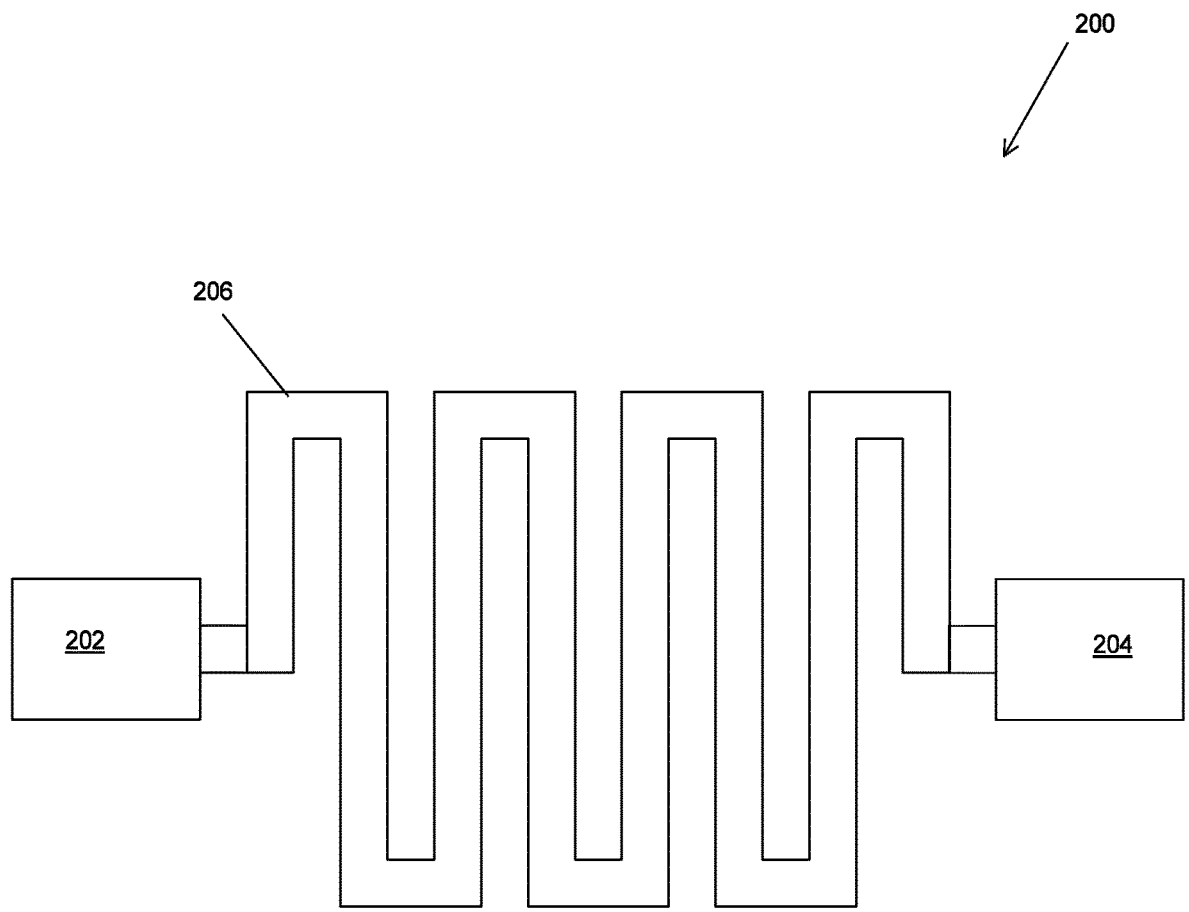
FIG. 2 is an example of a thermally induced pattern between two points in another example embodiment of the disclosure.

Referring to FIG. 2, a sample thermally scanned pattern 200 is illustrated. A first portion 202 is desired to be connected to a second portion 204. Connecting these discrete portions is a zig-zag shaped track 206 that stretches the distance from the first portion 202 to the second portion 204. As will be understood, the shape of the track 206 may be altered according to the needs of the architect. Less or greater lengths of track 206 may be used. The track 206 may have more complex shapes as well, therefore the principal geometric plane shapes or zig-zag pattern should not be considered limiting. In embodiments, an electrical connection may be made to both the first portion 202 and the second portion 204 such that alteration or deformation of the track 206 can be monitored as the change in resistance. Thus, it is possible to ascertain the amount of stress on a component by reading an electrical impedance or resistance level of the circuit, allowing accurate prediction of stress that may be sent to operators in the up-hole environment. Previously, macro-shaped stress and strain gauges were needed to provide a crude stress or strain rate. In the downhole environment, however, these stress and strain gauges were subject to structural loading and potential failure from the environmental conditions.

In one embodiment of the disclosure, a strain gauge may be fabricated by locally pyrolyzing a surface of a nonconductive polymer or polymer-rich composite. In this embodiment, the nonconductive polymer is a polyimide with carbon nanomaterials (e.g. graphene). In this embodiment, the pyrolyzing was achieved using a laser system configured with only 10 to 100 W 10.6 µm $CO_2$ laser. Typical speeds at which the pyrolyzing can occur may be 1 to 25 cm/second.

In analysis of the created thermally induced graphene sensing circuitry, the carbon layer was characterized by Raman spectroscopy. The Raman spectrum recorded from the carbonized layer is in the range of 1000-3000 $cm^{-1}$ using an excitation laser source of 532 nm. The distinctive shapes of 2D-band (~2700 $cm^{-1}$) and G-band (~1584 $cm^{-1}$) are indicative for the presence of graphene in a top layer.

Figure 3:
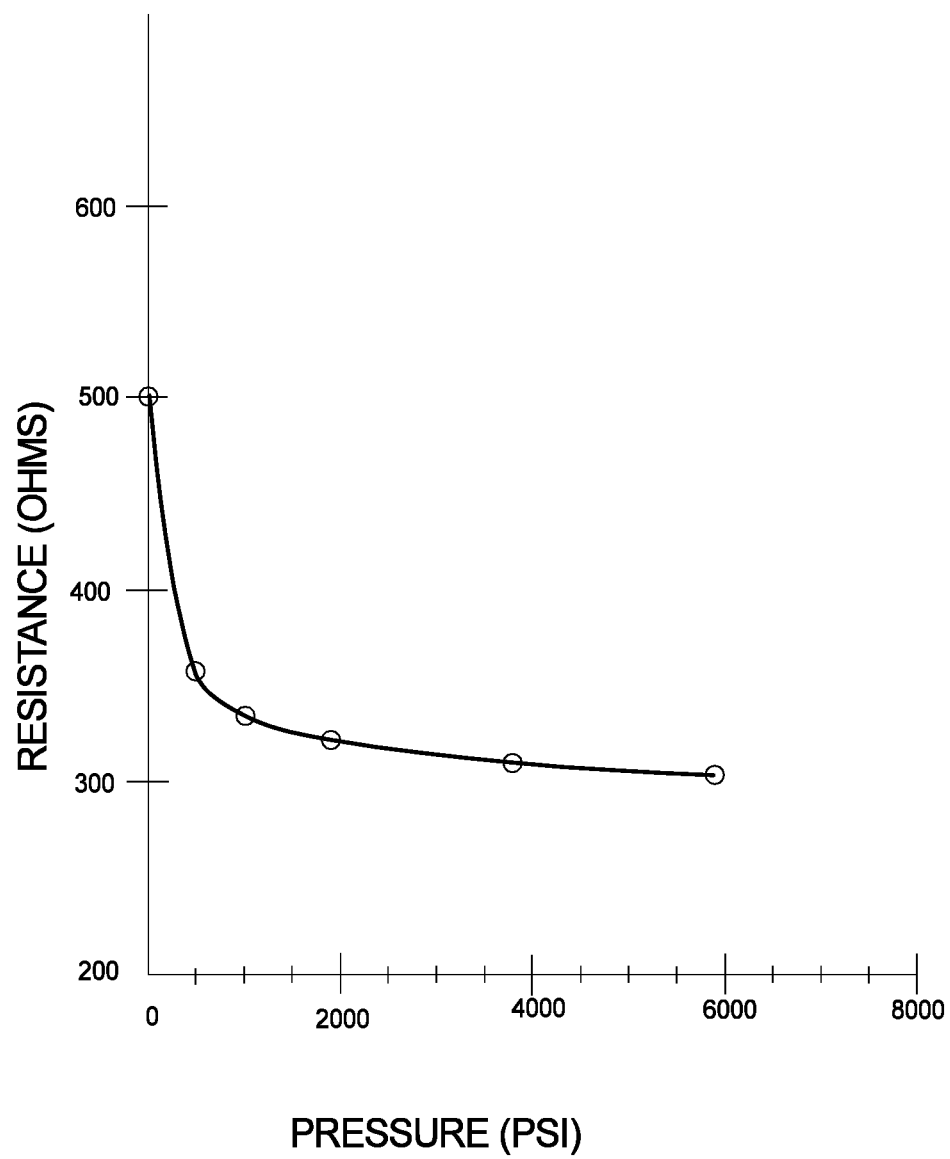
FIG. 3 is a graph of resistance in ohms vs pressure in pounds per square inch for a resistance change for different levels of pressure for a graphene sensing circuitry.

In this example embodiment, the carbonized layer has an active area of 0.25 inches (0.635 cm) wide and 2 inches (5.08 cm) long. The carbonized layer was evaluated at room temperature, and a change in the electrical resistance of the layer during compression was noted during compression by a tensile frame. Referring to FIG. 3, the plot of the resistance change for pressure is shown. As evaluated, the maximum resistance was approximately 500 ohms at zero pressure. The value of resistance decreased down to approximately 300 ohms at the maximum pressure during the test.

Figure 4:
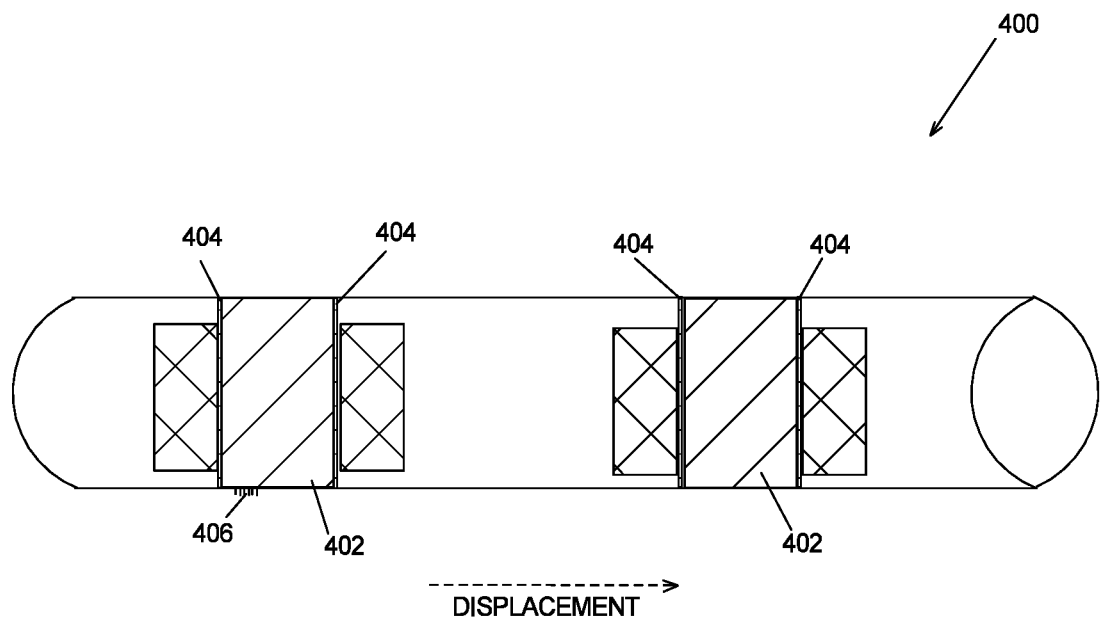
FIG. 4 is an example of a contact pressure and position sensor using a graphene sensor skin in contact with a sealing (packer) element in one example embodiment of the disclosure.
Figure 5:
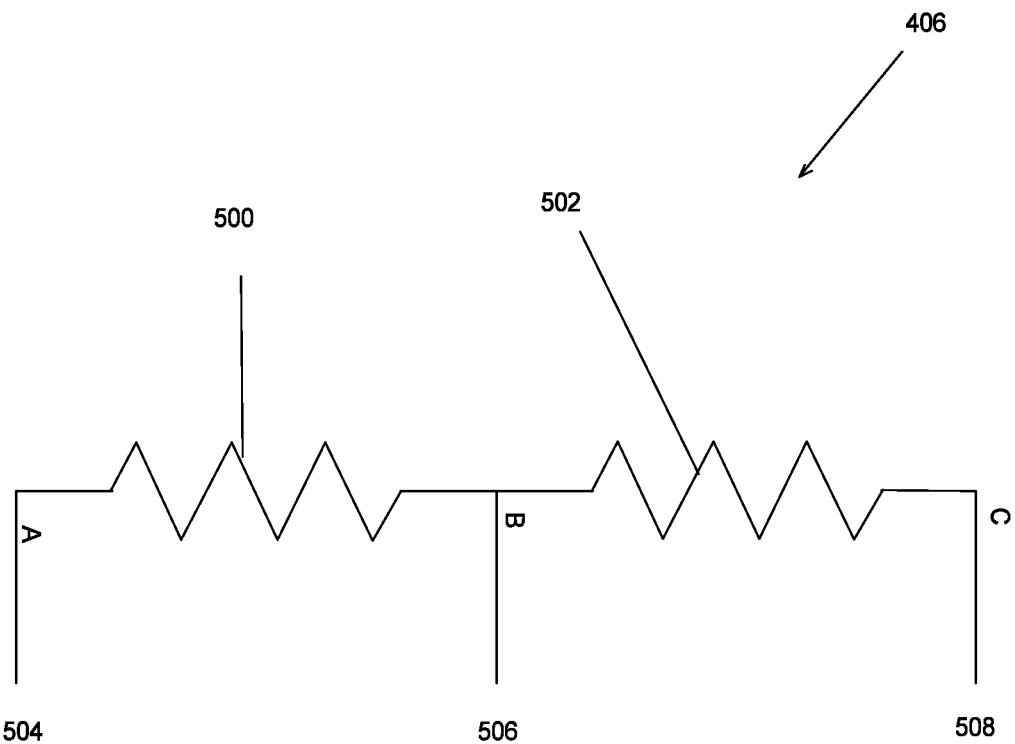
FIG. 5 is an expanded view of a graphene sensor in one example embodiment of the disclosure.

Referring to FIG. 4, an example of a contact pressure and position sensor is illustrated. Referring to FIG. 5, a theoretical illustration of a graphene sensor in contact with the skin of the component is shown. The graphene sensor may be directly placed onto the component, or alternatively on the complementary part it is in contact with. Referring to FIG. 4, a solid tubular arrangement 400 is disclosed. As will be understood, the solid tubular arrangement 400 is merely illustrative and should not be considered limiting. The arrangement 400 may be hollow shaped, solid bar shaped, or have more complex shape configurations. The solid tubular arrangement 400 has several parts that are configured to be monitored by graphene sensing circuitry formed by the method described above. For example, an anti-extrusion ring 404 is located at the edges of an elastomeric seal 402. A graphene sensor 406 is located to provide a sensing capability for the arrangement 400. As will be understood, multiple graphene sensors 406 may be placed over the outside surface of the arrangement 400.

In the illustrated embodiment, it may be desired to prevent the elastomeric seal 402 from receiving excessive force. To prevent this from occurring, a surface thermally induced graphene sensing circuit sensor 406 is located at the exterior of the elastomeric seal 402. Thus, when the elastomeric seal 402 experiences a force, the graphene sensing circuit sensor 406 will experience a resistance change. As previously indicated with respect to FIG. 3, the resistance of the sensor 406 may decrease, indicating a force placed upon the arrangement 400 in the vicinity of the elastomeric seal 402. As displacement occurs, along the dotted line shown at the bottom of the figure, the stress will be increased and may be identified by measuring the resistance of the sensor 406.

Referring to FIG. 5, a schematic representation of the sensor 406 is illustrated. Electrical connections may be made at connection points 504, 506 and 508. The electrical connections can provide a current to the sensor 406 to allow a user to identify a change in resistance once portions of the sensor 406 are placed under a structural loading. The structural loading may be, for example, a complex three-dimensional mechanical stress leading to strains, as non-limiting types of stresses and forces. The sensor 406 has two different resistor portions 500 and 502 that may be considered to be similar to the zig-zag portion (track) 206 in FIG. 2. As will be understood, the sensor 406 may be created in by a method 100 similar to that described in FIG. 1.

As illustrated in FIG. 5, two different circuits are connected together, wherein a first portion contains the resistor portion 500 and the second portion contains the resistor portion 502. Other configurations are possible. For example, a longer sensor 406 may be used along the entire bottom of the elastomeric seal 402 so that the entire portion of the seal 402 is monitored. As will be understood, the sensor 406 may be placed upon a metallic component or may be placed on a movable surface such as an elastomeric compound that is configured to expand.

Figure 6:
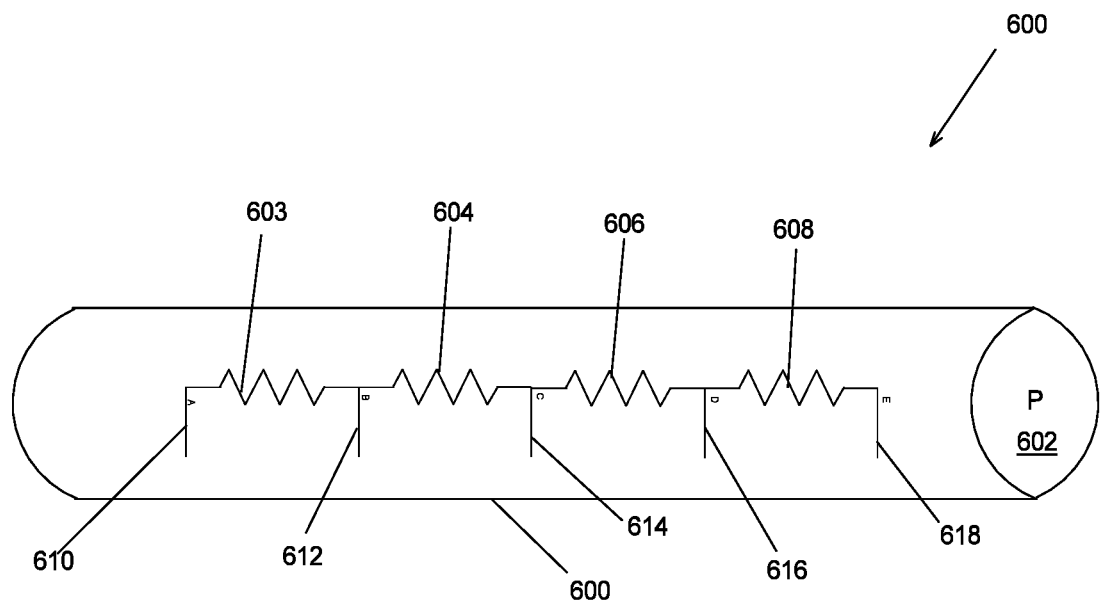
FIG. 6 is an example of pressure sensors on an outside diameter of a casing to prevent burst or buckling from structural load in one example embodiment of the disclosure.

Referring to FIG. 6, an example of pressure sensors being placed on an exterior surface of a casing 600 is illustrated; alternatively, or complementarily pressures sensors may be positioned on the internal surface of the casing. The casing 600 is hollow and holds a pressure 602 within the internal space. In this embodiment, it is desired to ensure that pressure sensors 603, 604, 606, 608 are located along the periphery or surface of the casing 600. Connections may be made to each of the pressure sensors 603, 604, 606, 608 at connection points 610, 612, 614, 616, 618. Knowing the material and geometric configuration of the casing, the amount of pressure P for both yield and ultimate capacity basis may be calculated. The pressure sensors 603, 604, 606, 608 may be used to check how close the pressure under service conditions is compared to both the yield and ultimate load capability. By monitoring the pressures, operators can prevent the casing 600 from exceeding thresholds for safe operation. These thresholds may be, for example, based upon code requirements for different pressure components.

For configurations with a long series of sensors, operators may compare and contrast data that is monitored. For example, if there are four individual sensors located on an exterior of a casing and the pressure within the casing is consistent, then the stress on each one of the sensors should be equivalent. In the case where a thinning of a wall of the casing is occurring, stress in one section of the casing may be greater than other sections of casing. An operator, therefore, may be able to identify problems within the casing from localized overloading prior to these overloadings becoming a significant structural problem.

In another example embodiment, where a long series of sensors is located on a casing, the sensors can be used to determine other characteristics. For example, if the casing is configured to hold a specified pressure, however, two of a series of four sensors show a measured pressure and two of the four sensors do not show a measured pressure, an operator may determine that a leak has occurred between the sensors in line where the pressure goes from a pressurized state to a non-pressurized state. Thus, such intelligent sensors may be able to detect process quantities.

In embodiments, wires may be run to the connection points on the thermally induced graphene sensing circuitry such that one or more electrical resistances, or impedances across the circuit are measured. These wires, for example, may be securely deployed onto the tools, and attached to a casing or component such that the wires do not detach during tool operation.

Aspects of the disclosure may be used and adapted to offer an additive manufacturing process for the construction of a layer-by-layer component that is subsequently conductive to electrification. In additive manufacturing, layers of material(s) may be deposited in preferred arrangements to achieve a desired final configuration, more typically a new part. To this end, the deposition may be made of different types of materials, such as metals, plastics, composites or other materials. Aspects of the disclosure can include laser/power source heating of different circuit configurations thereby achieving the desired thermally induced circuitry. These circuits can be located within the component that is being additively manufactured, may be located on an internal surface or on an external surface. Thus, in instances where additive manufacturing is performed, electrical leads to the thermally induced electrical circuit can be "built within" the device, alleviating the need for connecting wires within the component. Thus, except for the provision of actual voltage to connecting portions, the additive manufactured component may be self-contained.

Different types of additive manufacturing may be used to create layers for the overall component. These additive manufacturing processes may include powder-bed fusion, direct energy deposition, binder jet and spray coating, as non-limiting examples.

Figure 7:
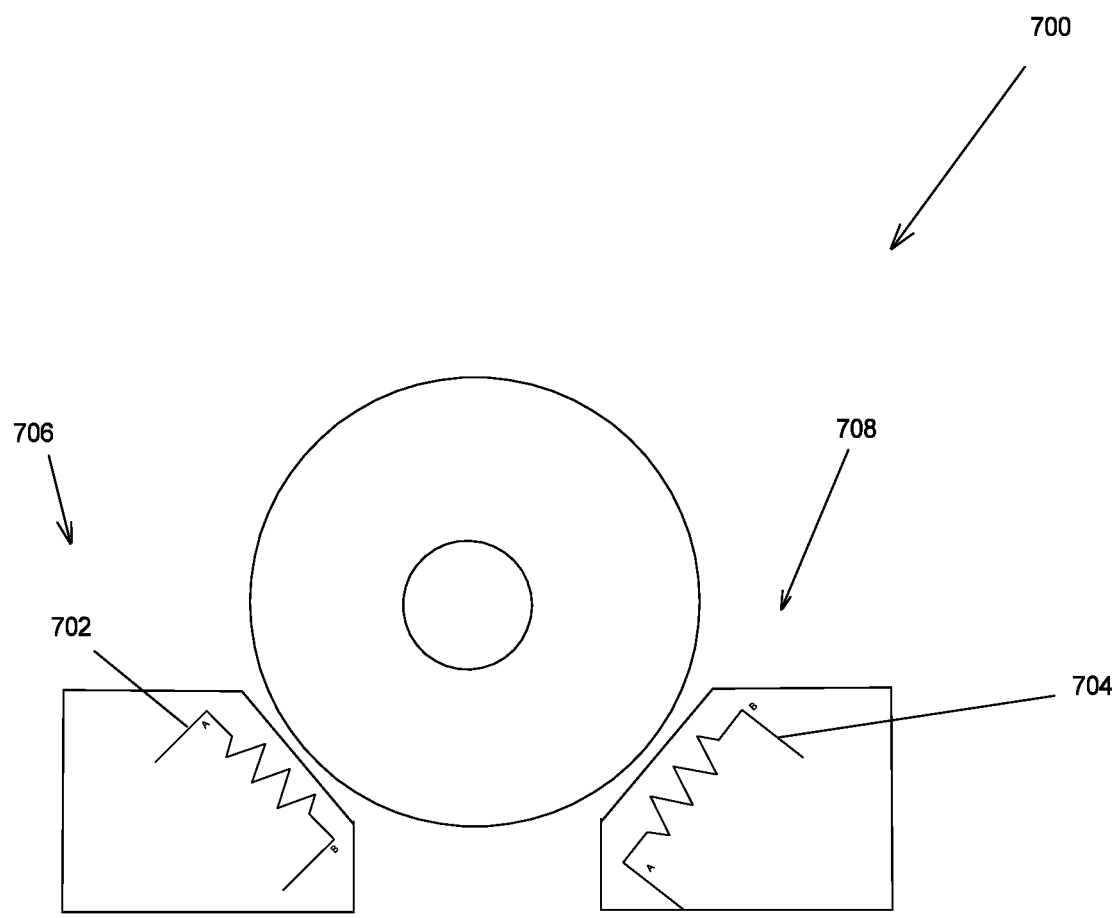
FIG. 7 is an example of an intelligent valve configuration in one example embodiment of the disclosure.

Referring to FIG. 7, a cross-section and schematic view of an intelligent valve 700 is illustrated. The intelligent valve 700 is a valve that may control a flow of fluid from a first point to a second point. In conventional valve apparatus, the valve may be just a pressure component. Such conventional valve apparatus is not monitored for changes in mechanical or pressure loading, or environmental degradation wherein corrosion for instance may lead to changes in stresses within the valve. Using the methods described, a thermally induced graphene sensing circuitry may be created on a valve 700 to create an intelligent valve. As can be seen, a first circuit 702 and a second circuit 704 are created on the valve 700. The first circuit 702 is configured to measure forces on the first portion 706 and a second circuit 704 is configured to measure forces on the second portion 708.

Figure 8:
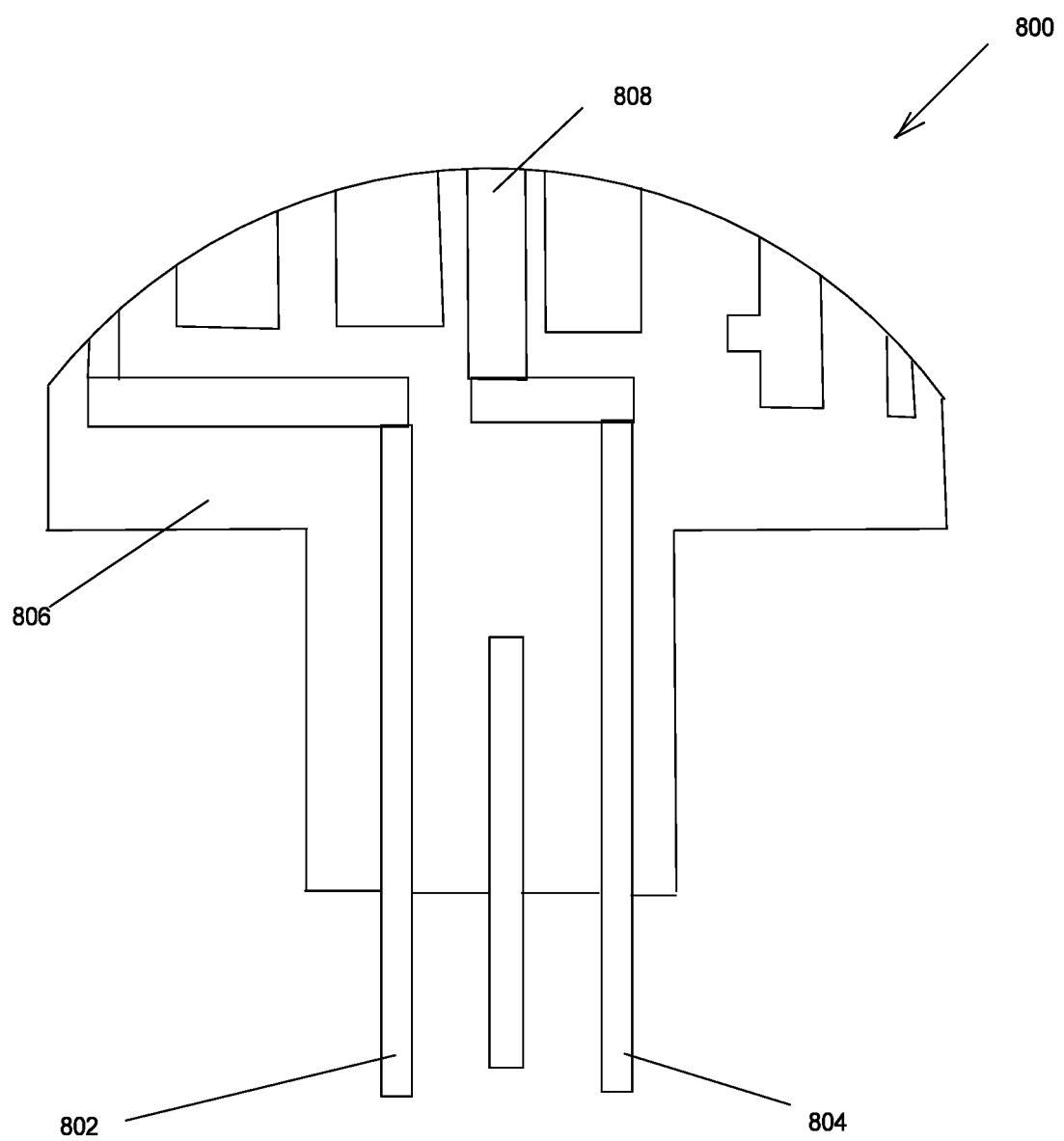
FIG. 8 is a cross-section of a button electrode in one example embodiment of the disclosure.

Referring to FIG. 8, a button electrode 800 is illustrated. The button electrode 800 may be configured by the methods, described above. The button electrode 800 is configured with an internal electrode 804, a guard electrode 802, as well as an insulator 806. The internal conductive paths illustrated may be made at least in part by graphene. As will be understood, other configurations are possible, and the illustrated configuration is but one of the possible arrangements for the disclosure.

Figure 9:
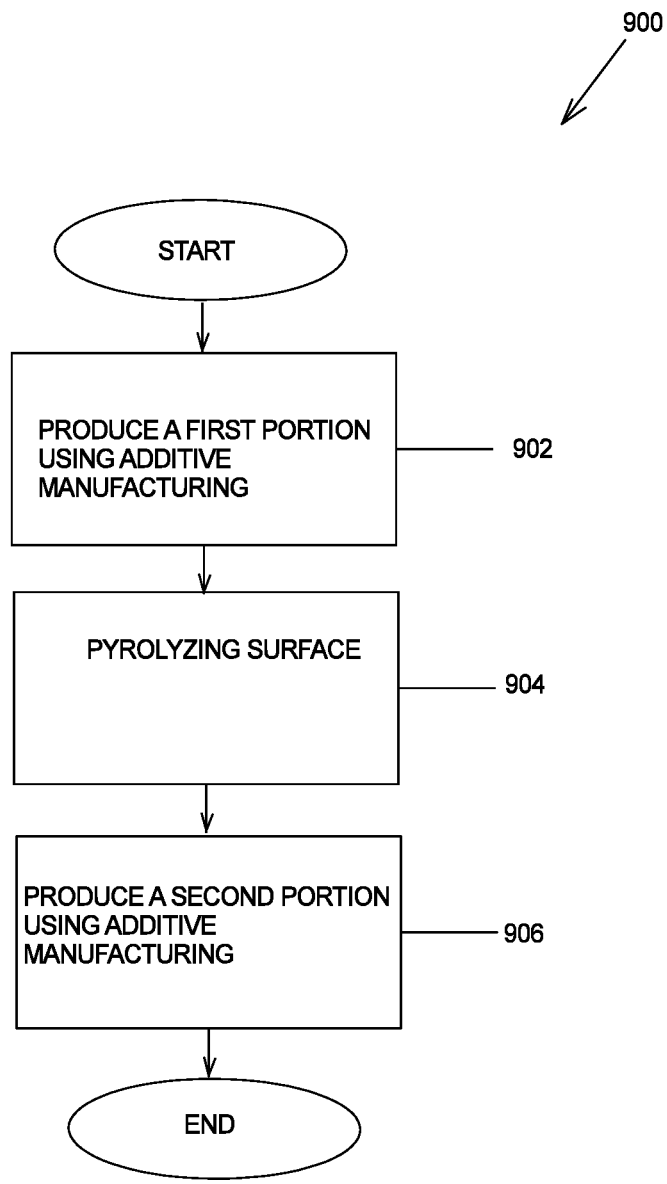
FIG. 9 is a method of making a thermally induced graphene sensing circuit through additive manufacturing, To facilitate understanding, identical reference numerals have been used, where possible, to designate identical elements that are common to the figures ("FIGS"). It is contemplated that elements disclosed in one embodiment may be beneficially utilized on other embodiments without specific recitation.

Referring to FIG. 9, a method 900 is illustrated for making an oil field service component through an additive manufacturing process. The component may be, as non-limiting embodiments, a casing, a pipe, components of a drill string, test string, or completion string and involves a variety of flow-control devices or valves, and zone isolation components such as packer and plugs. In this embodiment, the method produces thermally induced graphene sensing circuitry in an oil field service or permanent production component. At 902, the method includes producing a first portion of the oil field component with a material using additive manufacturing; the material is selected to be suitable to thermal-induce graphene. At 904, the method includes pyrolyzing a surface of the oil field service component in a pattern, wherein the pyrolyzing causes the graphene to form and accumulate in the pattern. At 906, the method includes producing the second portion of the oil field component with the second additive manufacturing process. The first and second additive manufacturing processes may be standard and not involve thermally induced graphene. The pyrolying may occur through projection of a laser onto a surface of the component being manufactured.

Numerous types of oil field components may be manufactured using this technology. As a non-limiting list of components, packer elements, bridge plug elements, liner-hanger elements and casing may be manufactured with such methods. Other types of downhole components may also be made with the technologies described, including tools for casing drilling, cementing products, such as cementing plugs, cable protectors, float equipment, centralizers, casing shoes, centralizers, stop collars and deployment aids. Diagnostic equipment may also be manufactured with methods described, including nuclear tools, pressure reading equipment, oil-gas analyzers and wireline equipment.

Components may be long in length or short in length. Loads that may be measured include loads from mechanical or thermal loads. Data may be retained over a period of time and then rechecked to determine if the component has degraded over time. Such degradation may occur from erosion, chemical interaction, mechanical scouring, oxidation and other processes.

In instances where data is to be retained, embodiments of the disclosure may use a computer, memory storage device, universal serial bus memory arrangement or cloud storage, as non-limiting embodiments, to store data. The stored data may be retrieved and later compared to as measured arrangements to check for progression of stress conditions for components measured. In other embodiments, knowing the actual values of stress and comparing these values of stress to predicted values of stress can verify an original "as installed" configuration when newly installed in field locations. Thus, the creation of the circuits configured can be used to verify that the configuration, as manufactured, meets expected strength parameters. Such a design can be used to quickly verify component quality produced from a manufacturer. Such confirmatory testing allows manufacturers to have additional safety related data upon which to rely for placement of components in economically sensitive installations.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may be varied in many ways. Such variations are not to be regarded as a departure from the disclosure, and all such modifications are intended to be included within the scope of the disclosure.

While embodiments have been described herein, those skilled in the art, having benefit of this disclosure, will appreciate that other embodiments are envisioned that do not depart from the inventive scope. Accordingly, the scope of the present claims or any subsequent claims shall not be unduly limited by the description of the embodiments described herein.

What is claimed is:

1. A method for producing thermally induced graphene sensing circuitry, comprising:
    preparing a surface of a component for placement of a coating on the surface;
    coating at least a portion of the surface of the component with a first polymeric material that includes carbon;
    applying a thermal scan to the coating of the first polymeric material to generate a pattern comprising graphene on the surface of the component, wherein the graphene is generated by the thermal scan, and wherein the pattern forms a printed circuit and comprises a zig-zag shape;
    coating at least a second portion of the surface of the component with an electrically-insulating second polymeric material;
    defining openings in the coating of the second polymeric material by leaving specific areas of the pattern uncovered when coating at least the second portion of the surface of the component with the electrically-insulating second polymeric material, wherein the openings provide access to the pattern; and
    adding electrical connections to the pattern, wherein the electrical connections include at least endpoints to the printed circuit.

2. The method according to claim 1, wherein the pattern is created on to the surface of the component by projecting a photonic source on the coating of the first polymeric material.

3. The method according to claim 1, wherein the pattern is created on to the surface of the component by applying a plasma source to the coating of the first polymeric material.

4. The method according to claim 1, further comprising repeating one or more of the preparing, coating, applying, defining, and adding operations of claim 1 to form additional printed circuits on the surface of the component.

5. The method according to claim 1, wherein the coating of the second polymeric material is formed by spraying.

6. The method according to claim 1, wherein the coating of the second polymeric material is formed by an additive manufacturing process.

7. The method according to claim 1, wherein the pattern is created on to the surface of the component by pyrolyzing the first polymeric material.

8. The method according to claim 1, wherein the first polymeric material includes a polymer selected from the group consisting of polyimide, polytetrafluoroethylene, polyetheretherketone, and polyphenylene sulfide.

9. The method according to claim 1, wherein the carbon of the first polymeric material is selected from the group consisting of oxides, nitrides, sulfides, phosphides, carbides, carbon nanotubes, fluorene, and graphene.

10. The method according to claim 1, wherein the printed circuit is part of a strain gauge.

11. The method according to claim 1, wherein the printed circuit is part of a pressure sensor.

12. The method according to claim 1, wherein the printed circuit is part of a position sensor.

13. The method according to claim 1, wherein the printed circuit is part of sensing circuity of an intelligent valve position sensor.

14. The method according to claim 1, wherein the printed circuit is part of a button electrode.

15. The method according to claim 1, wherein the component is a solid or hollow tube.

16. The method according to claim 1, wherein the component is an elastomeric seal.

17. The method according to claim 1, wherein the component is a casing.

18. The method according to claim 1, wherein the component is a valve.

19. The method according to claim 1, wherein the component is a button electrode.

* * * * *